(12) United States Patent  (10) Patent No.: US 7,529,143 B2
Sakuragi  (45) Date of Patent: May 5, 2009

(54) SEMICONDUCTOR MEMORY DEVICE, MEMORY MODULE HAVING THE SAME, THE TEST METHOD OF MEMORY MODULE

(75) Inventor: Shinji Sakuragi, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 169 days.

(21) Appl. No.: 11/804,179

(22) Filed: May 17, 2007

(65) Prior Publication Data

US 2007/0280013 A1  Dec. 6, 2007

(30) Foreign Application Priority Data

May 31, 2006  (JP) .............................. 2006-151958

(51) Int. Cl.
*G11C 7/00* (2006.01)
(52) U.S. Cl. ...................................... 365/200; 365/201
(58) Field of Classification Search .................. 365/200, 365/201, 230.08
See application file for complete search history.

(56) References Cited

U.S. PATENT DOCUMENTS 7,379,361 B2 *  5/2008  Co et al. ...................... 365/201

FOREIGN PATENT DOCUMENTS

JP  2003-338193  11/2003
JP  2003-346496  12/2003

* cited by examiner

*Primary Examiner*—Vu A Le
(74) *Attorney, Agent, or Firm*—Scully, Scott, Murphy & Presser, P.C.

(57) ABSTRACT

A semiconductor memory device according to the present invention is mounted on a memory module. The semiconductor memory device has a redundant circuit and a chip select circuit. The semiconductor memory device is allowed to be selected in the memory module by using a memory address that has been replaced with a redundant circuit as identifier information specific to the semiconductor memory device. The semiconductor memory device having the identifier information that coincides with a memory address inputted in a state of the memory module is selected and brought into an operation mode or a standby mode.

15 Claims, 10 Drawing Sheets

ADDRESS,COMMAND

STEP1

STEP2

STEP1

STEP2

STEP3

STEP4

STEP1

STEP2

STEP3

STEP4

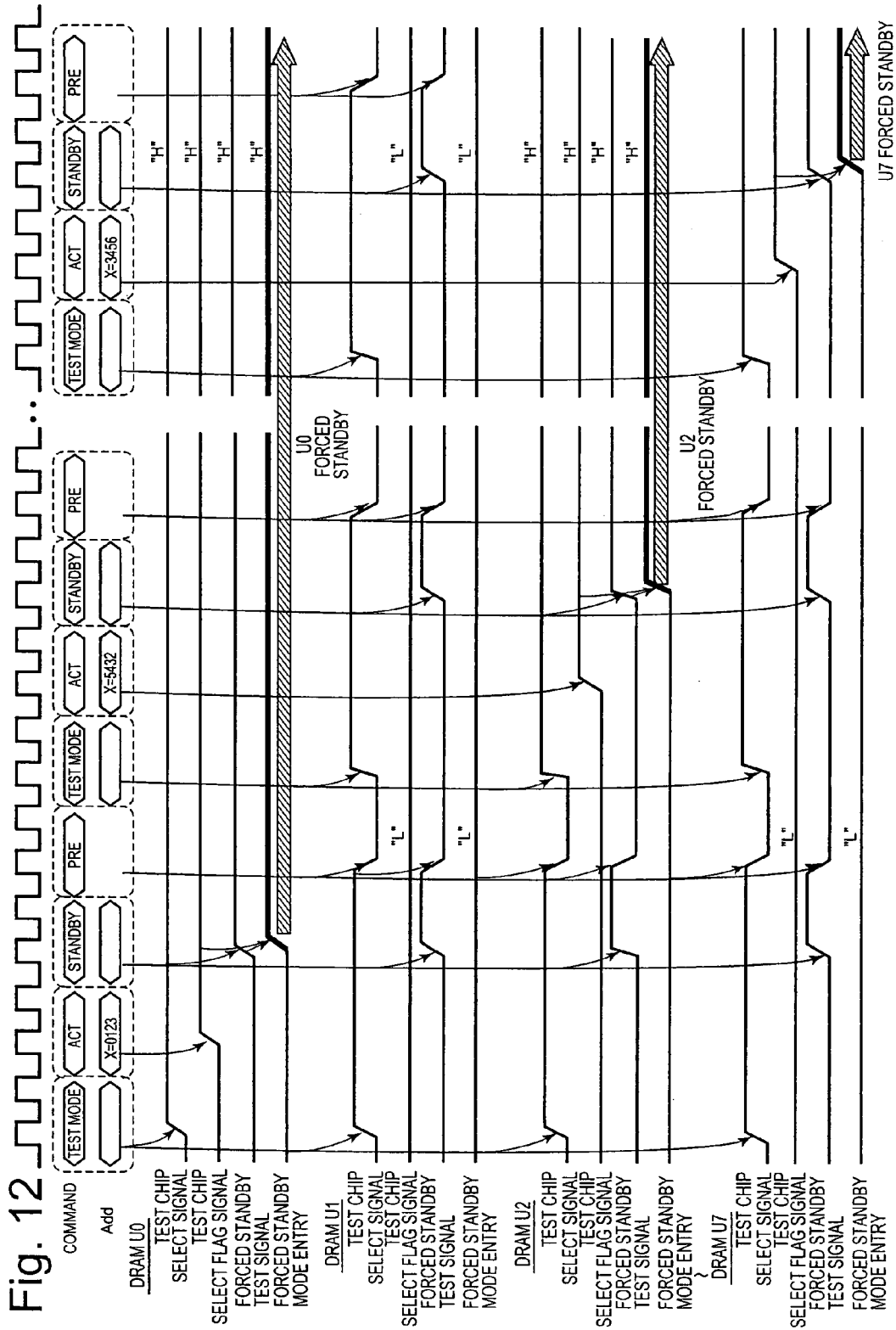

SEMICONDUCTOR MEMORY DEVICE, MEMORY MODULE HAVING THE SAME, THE TEST METHOD OF MEMORY MODULE

This application claims priority to prior application of JP 2006-151958, the disclosure of which is incorporated herein by reference.

BACKGROUND OF THE INVENTION

The present invention relates to a semiconductor memory device having a redundant circuit, a memory module having a plurality of such semiconductor memory devices, and a test method of a memory module.

Semiconductor memory devices have increasingly been integrated to a higher degree and increased in capacity. For example, dynamic random access memories (hereinafter referred to as DRAMs) having a memory capacity of 1 gigabit have been put into practical use. Redundant circuits for recovering defective memories are used in these mass storage DRAMs. The redundant circuit stores an address of a defective memory with a nonvolatile storage cell and changes the defective memory into a redundant memory to thereby recover the defective memory. The use of the redundant circuit to recover the defective memory can improve a yield and reduce the cost of the semiconductor memory device. A laser fuse, which cuts polysilicon wiring or metal wiring by a laser light, or an electric fuse, which electrically cuts or breaks and short-circuits polysilicon wiring or metal wiring, is used as the nonvolatile storage cell. Currently, electric fuses are used in many cases because a write operation can be performed even in a process after package assembly.

Recently, further miniaturization has been required for semiconductor memory devices. In many cases, semiconductor memory devices are shipped after they have been assembled into memory modules by semiconductor manufacturers. In these cases, since the memory modules are assembled by the semiconductor manufacturers, an evaluation and analysis operation or a test operation of the memory modules is added by the semiconductor manufacturers. Naturally, since defects are also produced in an assembly process of the memory modules, a recovery operation is performed with redundant circuits.

It is assumed that a malfunction occurs in one of mounted DRAMs or a portion of a DRAM. All of the mounted DRAMs or some of the mounted DRAMs are concurrently operated in a memory module. Accordingly, for example, if an abnormal current value is detected, then the DRAMs should be removed from the module substrate and examined to determine which DRAM has a defect. Furthermore, when a defective bit is to be recovered in a state of a memory module by an electric fuse, a replacement operation with a redundant memory is performed for all of the mounted DRAMs or a plurality of the mounted DRAMs. That is, redundant memories of DRAMs other than the defective DRAM are unnecessarily used, so that a defect recovery operation cannot be performed for those DRAMs.

These problems will be described in detail with reference to FIGS. 1 and 2. In a conventional memory module 1, as shown in FIG. 1, a plurality of DRAMs 3 are mounted on a module substrate 2. FIG. 1 shows an example in which eight DRAMs 3 (U0 to U7) are mounted on the module substrate 2. In this example, each DRAM 3 has an 8-bit arrangement, and the memory module 1 has a 64-bit arrangement. Data of 64 bits are concurrently inputted to or outputted from the memory module 1. In order to concurrently operate all of the DRAMs, common wiring is provided so that address and command signal lines are connected to each of DRAMs. Since all of the DRAMs are operated concurrently, the following problems arise during a test operation.

1) Even if an abnormal current of the memory module 1 is detected, it is impossible to determine which DRAM has a defect. This is because all of the DRAMs are operated even in a test operation for performing current measurement, making it impossible to detect which DRAM is defective.

2) In a test operation performed after the assembly into a memory module, a defective memory that has been detected in the memory module is replaced with a redundant memory by an electric fuse or the like. In this case, when a redundant circuit replacement signal is inputted from an external source, DRAMs other than the defective DRAM are also subjected to a replacement operation with a redundant memory for the following reasons. For example, it is assumed that, in a memory module having eight DRAMs of U0 to U7 as shown in FIG. 2, defects are detected in the DRAMs U2 and U4 during a test operation after the memory module has been assembled. It is also assumed that a defective bit address in the DRAM U2 is (X=0123, Y=4567) and that a defective bit address in the DRAM U4 is (X=4321, Y=8765). When the defective bit (X=0123, Y=4567) in U2 is replaced by an electric fuse, normal bits of the same address (X=0123, Y=4567) in the DRAMs (U0, U1, and U3 to U7) other than U2 are also replaced because all of the DRAMs are operated concurrently in the memory module. As a result, the redundant memory has been used in the DRAM U4. Accordingly, the defective bit (X=4321, Y=8765) in U4 cannot be replaced or recovered with the redundant memory.

In order to avoid these problems, there may be a method of selecting a DRAM with use of data signals that are independently assigned to respective DRAMs. However, general memory test devices cannot output data in which all data signals are completely independent, and most of them can merely output certain data signals repeatedly. Accordingly, even if such a function is used, bits of the same address are simultaneously replaced in about four or two out of eight DRAMs. Thus, redundant memories are unnecessarily used in several DRAMs other than a defective DRAM. Therefore, when these DRAMs include a defective bit, they lack redundant memories, so that the defective bits cannot be replaced in those DRAMs.

3) Recently, operating currents of memory modules have been increased by speeding-up of DRAMs and high-density packaging. Memory test devices having a limited power source capability cannot perform a test operation on such high-current memory modules because of voltage drops.

The following patent documents are prior art references relating to such redundant circuits.

Patent Document 1 (Japanese laid-open patent publication No. 2003-338193): A bare chip has an activation/deactivation control pad in addition to an input/output control pad. When the bare chip has a defect, it is brought into a deactivation state.

Patent Document 2 (Japanese laid-open patent publication No. 2003-346496): A semiconductor memory device has a defect information storage table for storing defect information including defective memory addresses and the number of defects in the defective memory addresses, in addition to r row redundant circuits and c column redundant circuits.

However, neither Patent Document 1 nor 2 has any descriptions or technical suggestions relating to the subject matter of the present invention.

As described above, in a conventional memory module, since a plurality of mounted DRAMs are concurrently operated during a test operation, a defective DRAM cannot be specified. Furthermore, redundant circuits in DRAMs other than a defective DRAM are unnecessarily used for the recovery of the defective DRAM.

SUMMARY OF THE INVENTION

An object of the present invention is to provide a semiconductor memory device capable of allowing only a specified DRAM to be operated in a memory module.

According to the present invention, a semiconductor memory device having a redundant circuit is provided. According to a first aspect, the semiconductor memory device comprises a chip select circuit operable to determine whether to be selected by a test chip select signal and a redundancy enable signal and output a chip select flag signal in a chip select test mode.

In the semiconductor memory device according to the first aspect, a defective memory address that has been replaced with the redundant circuit is used as identifier information for the semiconductor memory device in the chip select test mode.

In the semiconductor memory device according to the first aspect, the identifier information is a defective memory address read in a redundant memory address read test operation by a tester device, and the read defective memory address is stored as the identifier information in the tester device.

In the semiconductor memory device according to the first aspect, the semiconductor memory device having identifier information that coincides with an input address from the tester device is set to one of an operation mode and a standby mode.

In the semiconductor memory device according to the first aspect, only the semiconductor memory device having identifier information that coincides with an input address from the tester device is activated so that a defective memory is replaced with a redundant circuit.

In the semiconductor memory device according to the first aspect, an internal circuit is set to one of an operation mode and a standby mode by the chip select flag signal.

In the semiconductor memory device according to the first aspect, an input initial-stage circuit is disabled in the standby mode.

In the semiconductor memory device according to the first aspect, the standby mode is maintained until a reset signal for the standby mode is inputted.

According to a second aspect of the present invention, a memory module characterized by comprising any one of the semiconductor memory devices described above.

According to the present invention, a test method of a memory module having a plurality of semiconductor memory devices including a redundant circuit is provided. According to a third aspect of the present invention, the test method comprises the steps of providing a chip select circuit for the semiconductor memory devices, reading a defective memory address that has been replaced with the redundant circuit, holding the read defective memory address as identifier information for each semiconductor memory device in a tester device, and outputting a chip select flag signal indicative of selection or non-selection from the chip select circuit based on inputted identifier information.

In the test method according to the third aspect, the chip select circuit is operable to determine whether to be selected by a test chip select signal and a redundancy enable signal.

In the test method according to the third aspect, among the read defective memory addresses, a first defective memory address that does not overlap defective memory addresses for other semiconductor memory devices mounted in the same memory module is used as identifier information.

In the test method according to the third aspect, a semiconductor memory device selected by the chip select flag signal outputted from the chip select circuit is operated in accordance with an inputted command.

In the test method according to the third aspect, a replacement operation with a redundant circuit is performed on a semiconductor memory device selected by the chip select flag signal outputted from the chip select circuit in accordance with an inputted redundant circuit entry command.

In the test method according to the third aspect, a semiconductor memory device selected by the chip select flag signal outputted from the chip select circuit is brought into a standby state in accordance with an inputted standby mode command.

A semiconductor memory device according to the present invention allows only a specific DRAM to be selected in a memory module by using address information on a replaced defective memory as identifier information (ID) for the DRAM. When a plurality of DRAMs according to the present invention are mounted on a memory module substrate so as to concurrently operate the DRAMs, only a specific DRAM can be selected. Accordingly, it is possible to perform an evaluation operation, a defect analysis operation, and a recovery operation of a specified DRAM mounted on a memory module. Therefore, according to the present invention, it is possible to obtain a semiconductor memory device having an excellent manufacturing yield with a redundant circuit having a high replacement efficiency.

BRIEF DESCRIPTION OF THE DRAWINGS

FIG. 12 is a timing chart explanatory of the standby operation in the second example of the present invention.

DETAILED DESCRIPTION OF THE PREFERRED EMBODIMENTS

A semiconductor memory device according to a first embodiment of the present invention will be described with reference to FIGS. 3 to 7.

Figure 1:
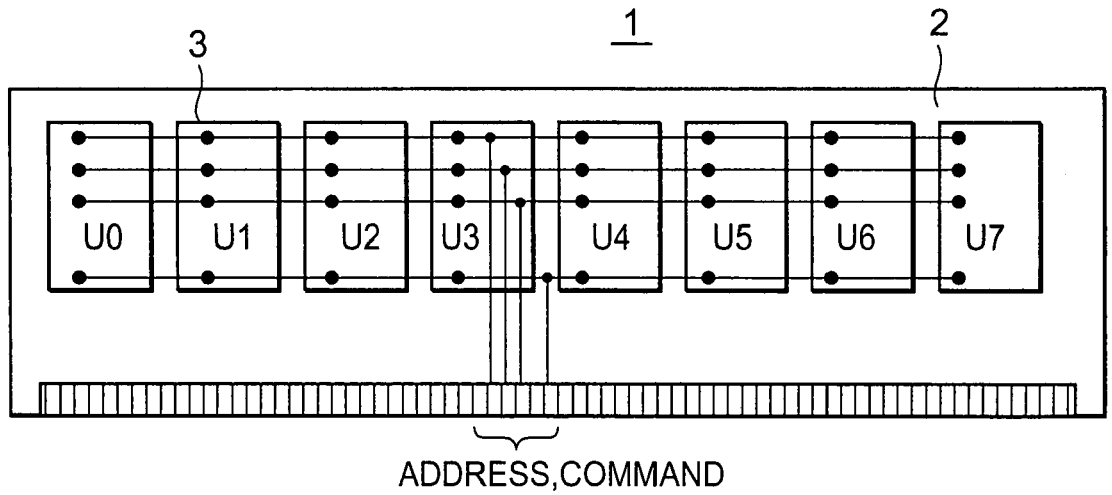
FIG. 1 is a diagram showing an arrangement of a general memory module.
Figure 2:
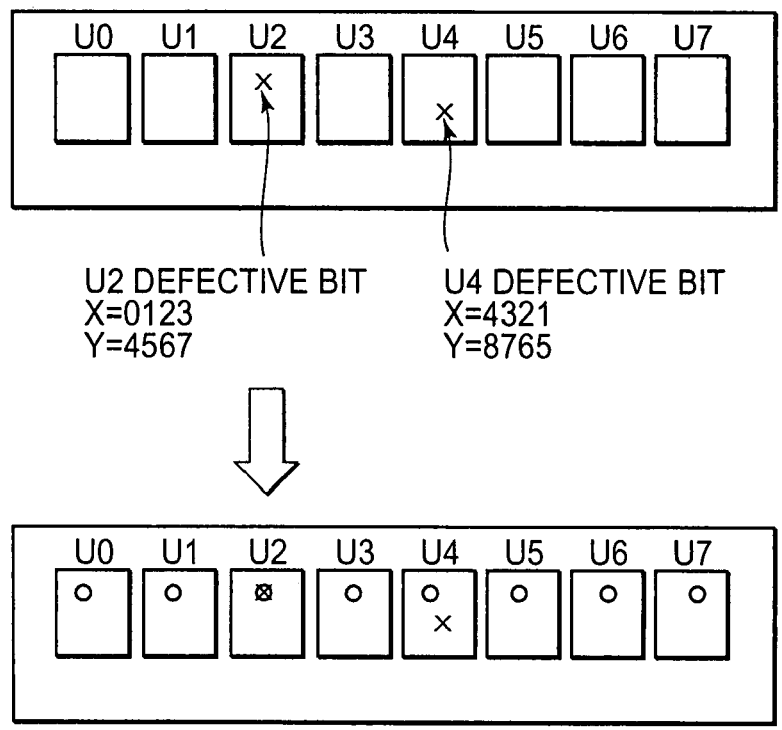
FIG. 2 is a diagram explanatory of a conventional replacement procedure with redundant circuits.
Figure 3:
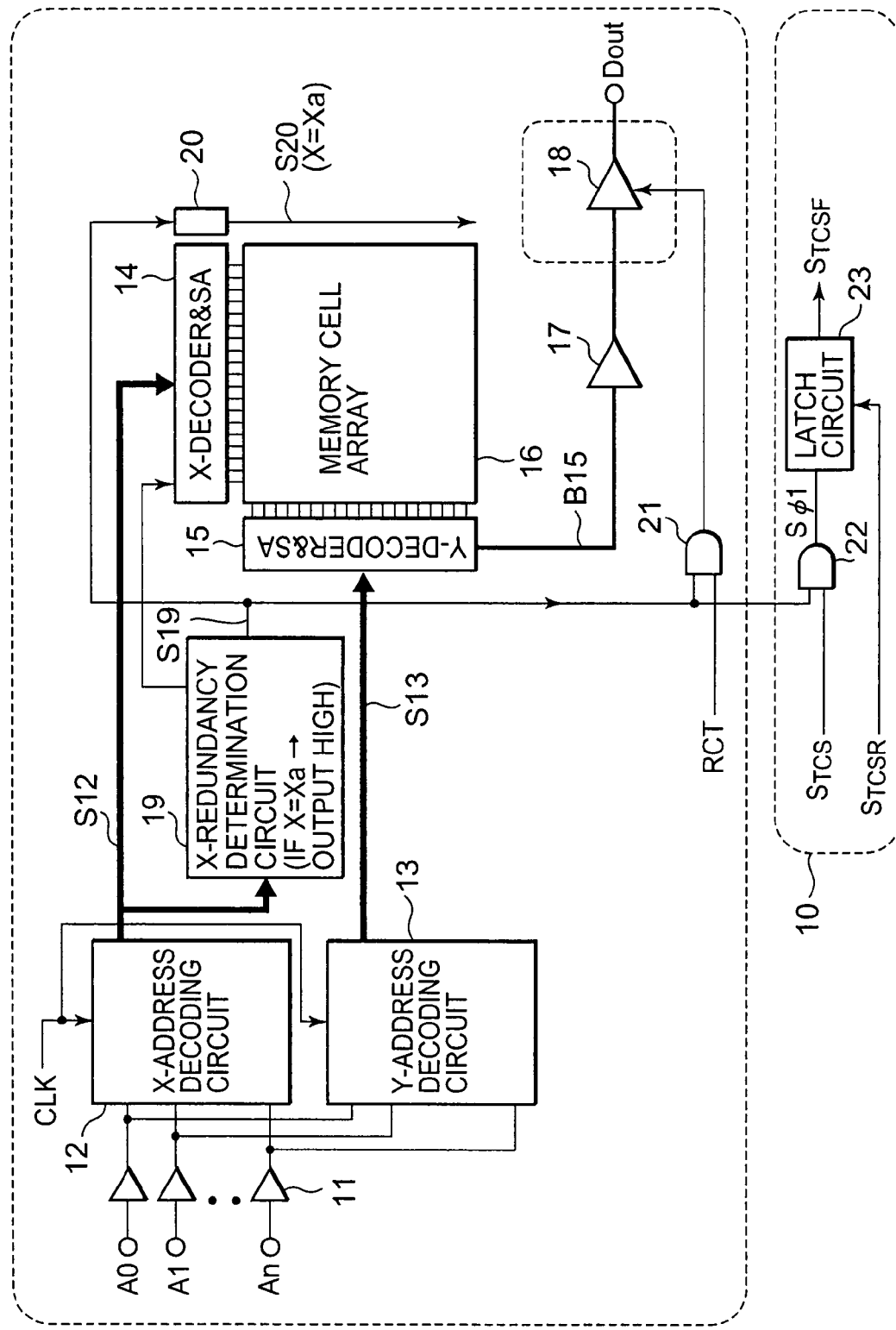
FIG. 3 is a block diagram showing an arrangement of a DRAM in a semiconductor memory device according to the present invention.

FIG. 3 is a block diagram showing an arrangement of a DRAM in a semiconductor memory device according to the first embodiment. FIG. 3 shows only the components which are necessary for explanation of an operation of the DRAM according to the present invention. Components that are the same as those in the DRAMs 3 shown in FIG. 1 will be described first. Address input initial-stage circuits 11 receive address signals A0 to An as external input signals. An X-address decoding circuit 12 and a Y-address decoding circuit 13 receive a clock signal CLK, decode the address signals, and output an X-address decoded signal S12 and a Y-address decoded signal S13, respectively. An X-decoder & SA 14 and a Y-decoder & SA 15 select one bit in a memory cell array 16 based on the X-address decoded signal S12 and the Y-address decoded signal S13, respectively. A data amplifier 17 amplifies data sent from the memory cell array 16 via the Y-decoder & SA 15 and an I/O bus B15, and an output buffer 18 outputs the amplified data $D_{out}$. An X-redundancy determination circuit 19 replaces a defective memory with a redundant memory to recover the defective memory. The DRAM in the present embodiment also includes an X-redundancy decoder 20 and an AND circuit 21. The X-redundancy decoder 20 is supplied with an X-redundancy enable signal S19 from the X-redundancy determination circuit 19 and outputs an X-redundancy signal S20.

The DRAM in the present embodiment also has a chip select circuit 10 including an AND circuit 22 and a latch circuit 23. The X-redundancy enable signal S19 output from the X-redundancy determination circuit 19, and a test chip select signal $S_{TCS}$ as a chip select test mode signal are inputted to the AND circuit 22. The latch circuit 23 is operable to latch an output signal Sϕ1 of the AND circuit 22 and output a test chip select flag signal (chip select flag signal) $S_{TCSF}$. The latch circuit 23 is reset by a test chip select reset signal $S_{TCSR}$.

Figure 4:
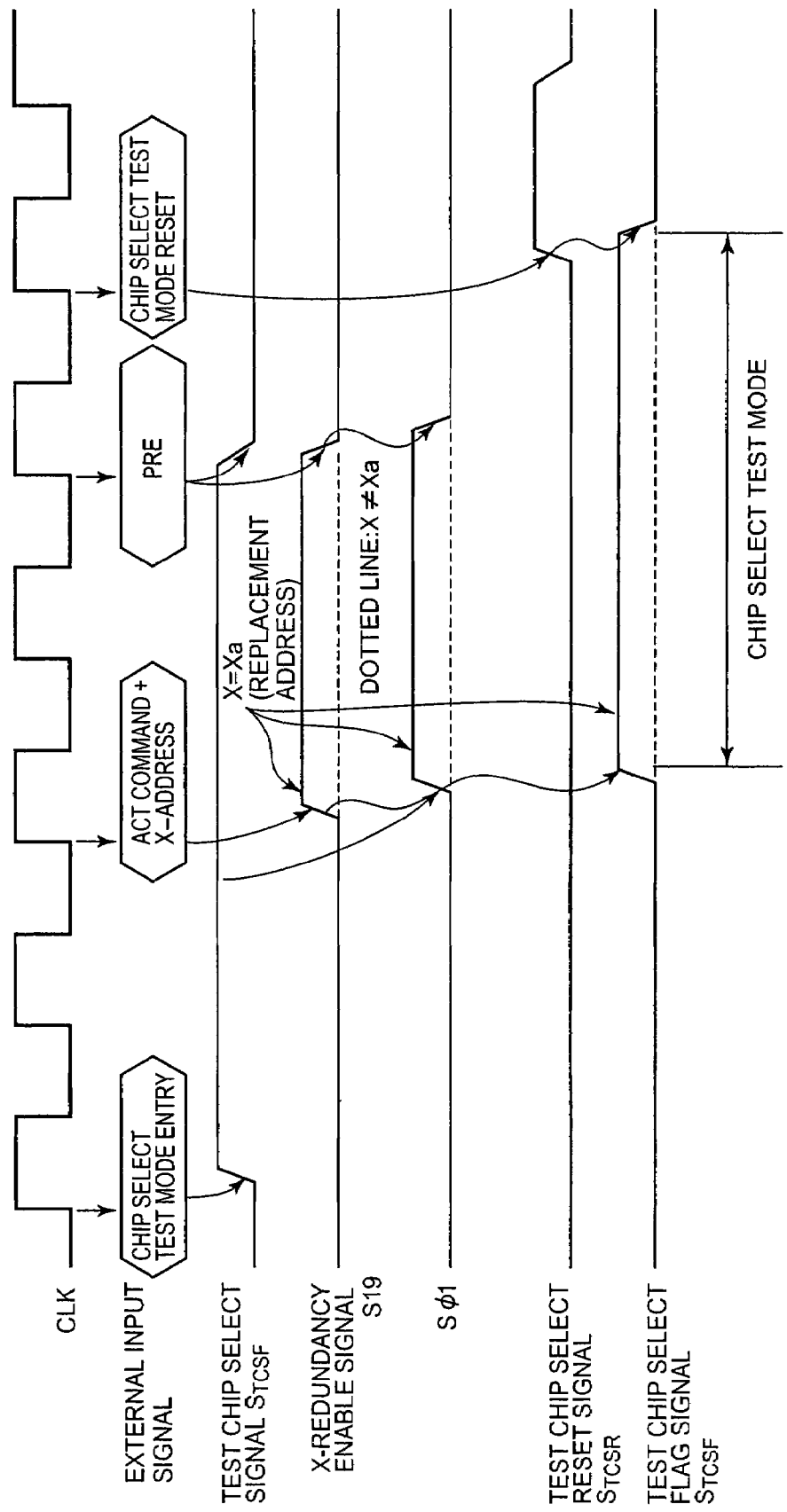
FIG. 4 is a timing chart explanatory of operation of the DRAM in the semiconductor memory device shown in FIG. 3.

Operation of the DRAMs shown in FIG. 3 will be described below with reference to a timing chart of FIG. 4. FIG. 4 shows signal waveforms of the clock signal CLK, the external input signal, the test chip select signal $S_{TCS}$, the X-redundancy enable signal S19, the output signal Sϕ1 of the AND circuit 22, the test chip select reset signal $S_{TCSR}$, and the test chip select flag signal $S_{TCSF}$. First, a command signal is inputted as the external input signal in synchronism with the clock signal CLK, and an entry into a chip select test mode is made by a command decoder circuit (not shown). The test chip select signal $S_{TCS}$ is activated from a low level L into a high level H by an internal test circuit (not shown).

Subsequently, an X-address activation signal (ACT command) and an X-address are inputted as the external input signal. If the inputted X-address coincides with address information (an X-redundancy address) that has already been replaced by a laser fuse or the like, then the X-redundancy enable signal S19 from the X-redundancy determination circuit 19 is changed from a low level L into a high level H. When the AND circuit 22 receives the test chip select signal $S_{TCS}$ and the X-redundancy enable signal S19 having a high level H, the output signal Sϕ1 of the AND circuit 22 is changed from a low level L to a high level H. The output signal Sϕ1 having a high level H is inputted to the latch circuit 23, so that the test chip select flag signal $S_{TCSF}$ is brought into a high level H.

On the other hand, if the inputted X-address does not coincide with the X-redundancy address, then the X-redundancy enable signal S19 remains a low level L, so that the test chip select flag signal $S_{TCSF}$ is maintained at a low level L, which is indicated by a dotted line. The test chip select flag signal $S_{TCSF}$ is a chip select flag signal indicating whether or not the chip is selected.

When an unselected state is then provided by a pre-charge command PRE or the like, the test chip select signal $S_{TCS}$ and the output signal Sϕ1 of the AND circuit 22 are changed from a high level H into a low level L. The state of the test chip select flag signal $S_{TCSF}$ can be maintained until entry of the test chip select reset signal $S_{TCSR}$.

Figure 5:
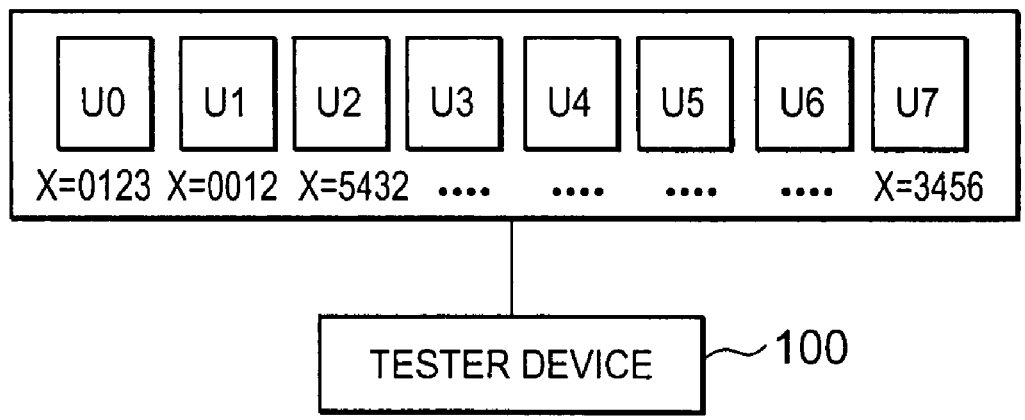
FIG. 5 is a diagram explanatory of a selection procedure of a DRAM according to the present invention.
Figure 5:
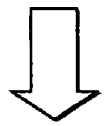
Figure 5:
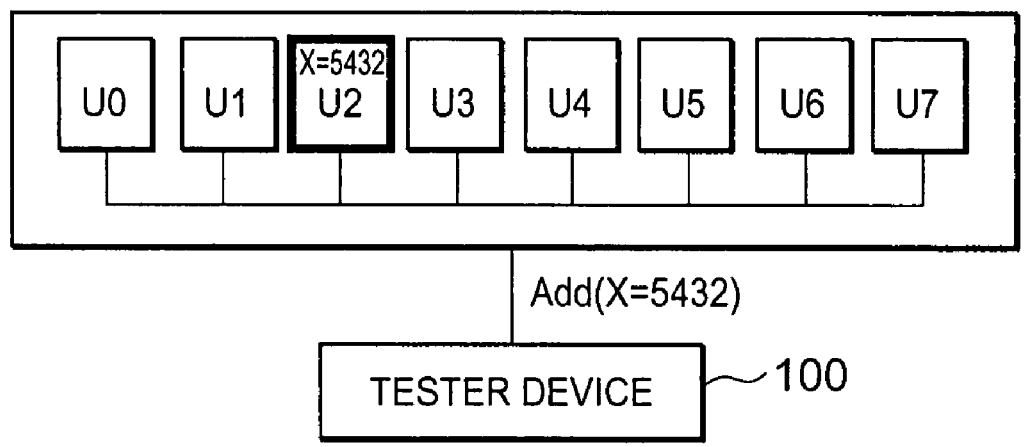

FIG. 5 shows a selection procedure of a specific DRAM in an actual memory module. Here, FIG. 5 illustrates an example in which only a DRAM U2 is selected from among DRAMs U0 to U7 mounted on a memory module. In Step 1, redundant memory addresses are read by roll call tests, and the read redundant memory addresses are used as identifier information (ID) for the respective DRAMs. The first redundant memory addresses that do not overlap redundant memory addresses for other DRAMs are used as the identifier information (ID) for the respective DRAMs. In Step 2, an address of identifier information (ID) is inputted so as to select a specific DRAM. In the present invention, because defective memories are replaced with redundant memories, the redundant memories and the defective memories have the same addresses. Thus, the terms of the redundant memory address and the defective memory address are used as synonyms.

In Step 1, redundant memory addresses that have been replaced by a laser fuse or the like during a wafer test operation are read by a redundant memory address read test (hereinafter referred to as a roll call test RAT) operation. The first address of the redundant memory addresses for each DRAM is assigned to identifier information (ID) for that DRAM. For example, the first redundant memory addresses of the respective DRAMs are assigned to identifier information (ID) for the DRAMs, such as U0: X=0123, U1: X=0012, U2: X=5432, ..., U7: X=3456. The identifier information (ID) is stored in a tester device 100.

Generally, memory addresses to be replaced vary according to DRAMs. The probability that the same memory address has been replaced in different DRAMs of the same memory module is considerably low and thus can be deemed to be zero. If the same memory address should have been replaced, that memory address is not used as identifier information (ID) but a subsequently read redundant memory address is used as identifier information (ID). Furthermore, in recent years, memory bits in which an operating region is marginal are replaced with redundant circuits even in non-defective mass storage DRAMs. Accordingly, there are no cases where no redundant circuits have been used in a DRAM. Thus, different redundant memory addresses are necessarily assigned to identifier information (ID) for different DRAMs.

In Step 2, a chip select test mode according to the present invention is set, and a redundant memory address X=5432 is inputted as identifier information (ID) for the DRAM U2. The chip select test mode signal is inputted to all of the DRAMs U0 to U7. Since the inputted memory address X=5432 is a redundant memory address for the DRAM U2, the test chip select flag signal $S_{TCSF}$ is changed from a low level L into a high level H only in the case of U2 in all of the DRAMs. Thus, the DRAM U2 can be selected. The test chip select flag signal $S_{TCSF}$ allows a specified DRAM to be selected into an operation mode, in which the specified DRAM is operated, or a forced standby mode, in which the specified DRAM is forcedly brought into a standby state, FIG. 6 is a circuit diagram showing the operation mode, in which a DRAM is selectively operated, and FIG. 7 is a circuit diagram showing the forced standby mode, in which a DRAM is forcedly brought into a standby mode.

Figure 6:
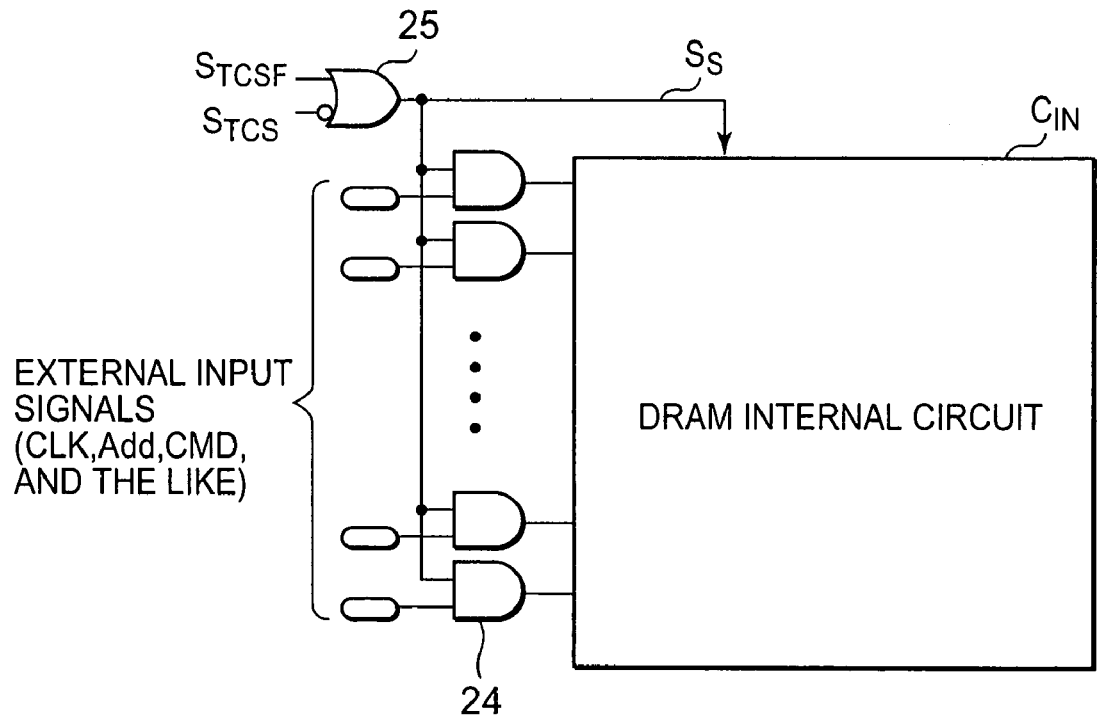
FIG. 6 is a circuit diagram of an operation mode according to the present invention.

In the operation mode circuit shown in FIG. 6, input initial-stage circuits 24, which receive external input signals such as a clock signal CLK, an address signal Add, and a command CMD, are formed by AND circuits. The external input signal is inputted to one terminal of each AND circuit 24, and an output of an OR circuit 25 is inputted to another terminal of each AND circuit 24. The test chip select flag signal $S_{TCSF}$ and an inversed signal of the test chip select signal $S_{TCS}$ are inputted to the OR circuit 25. When the test chip select signal $S_{TCS}$ has a low level L or the test chip select flag signal $S_{TCSF}$ has a high level H, the external input signals are transmitted to a DRAM internal circuit $C_{IN}$. Specifically, in a normal operation, when the test chip select signal $S_{TCS}$ has a low level L, or when the DRAM has been selected in a test mode and the test chip select flag signal $S_{TCSF}$ has a high level H, the DRAM can be operated by the external input signals. Furthermore, the DRAM internal circuit $C_{IN}$ can be set such that the OR circuit 25 outputs an internal circuit set signal $S_S$ to initialize necessary parts of the DRAM internal circuit $C_{IN}$ as needed.

Figure 7:
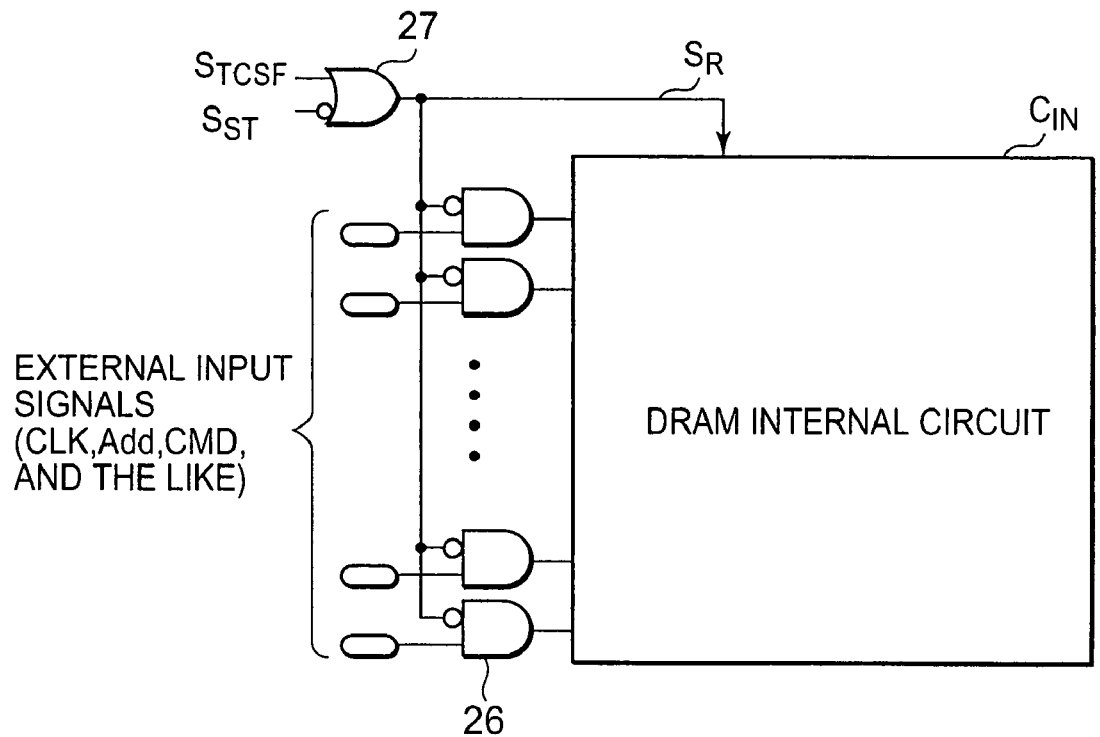
FIG. 7 is a circuit diagram of a forced standby mode according to the present invention.

In the forced standby mode circuit shown in FIG. 7, input initial-stage circuits 26, which receive external input signals such as a clock signal CLK, an address signal Add, and a command CMD, are formed by AND circuits. The external input signal is inputted to one terminal of each AND circuit, and an inversed signal of an output from an AND circuit 27 is inputted to another terminal of each AND circuit. The test chip select flag signal $S_{TCSF}$ and a forced standby test signal $S_{ST}$ are inputted to the AND circuit 27. When both of the test chip select flag signal $S_{TCSF}$ and the forced standby test signal $S_{ST}$ have a high level H, the external input signals are not transmitted to a DRAM internal circuit $C_{IN}$. If the DRAM is selected in the chip select test mode, then the test chip select flag signal $S_{TCSF}$ has a high level H. Accordingly, the input initial-stage circuits 26 are deactivated so that they do not receive the external input signals. That is, the DRAM is forcedly brought into a standby state. Furthermore, the DRAM internal circuit $C_{IN}$ can be reset such that the AND circuit 27 outputs an internal circuit reset signal $S_R$ to initialize necessary parts of the DRAM internal circuit $C_{IN}$ as needed.

In FIG. 7, all of the input initial-stage circuits 26 are deactivated by the output of the AND circuit 27. In this case, because a reset command is not received, the DRAM cannot be reset unless the power source is shut down. Only command inputs may be activated in order to resolve this problem. Alternatively, some of command inputs may be activated, and a test chip select reset signal $S_{TCSR}$, which will be described later, may be generated. In the present invention, a command input initial-stage circuit (not shown) for generating a test chip select reset signal $S_{TCSR}$ is not deactivated. Furthermore, while the input initial-stage circuits 26 may be left as they are, a decoding circuit in the DRAM internal circuit $C_{IN}$ may forcedly be deactivated. Thus, various methods can be applied to the present invention.

As described above, the DRAM according to the present invention has the chip select circuit 10 and is selectable by the test chip select signal $S_{TCS}$. A memory address replaced with a redundant circuit is used as identifier information (ID) specific to the DRAM. Only a selected DRAM can be brought into an operation mode or a standby mode by coincidence of inputted address.

Next, a first example and a second example of operation in a memory module having DRAMs according to the present invention will be described below.

FIRST EXAMPLE

Figure 8:
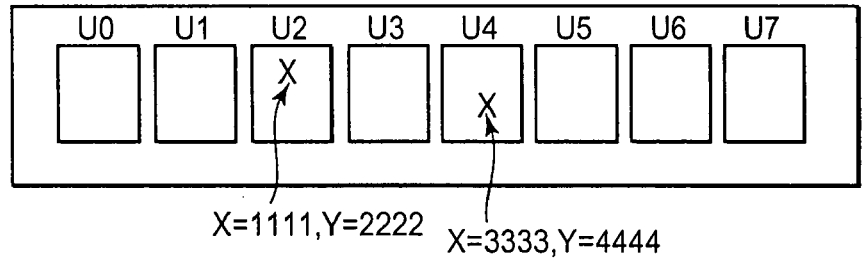
FIG. 8 is a diagram explanatory of a replacement procedure with redundant circuits in a first example of the present invention.
Figure 8:
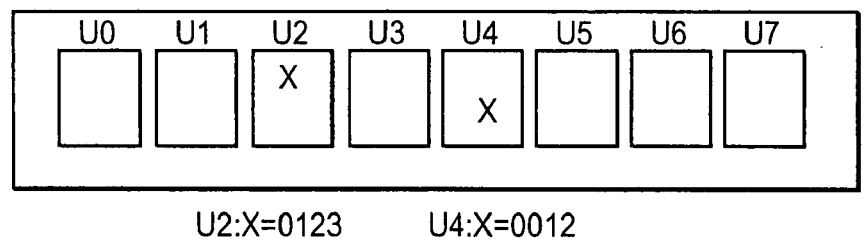
Figure 8:
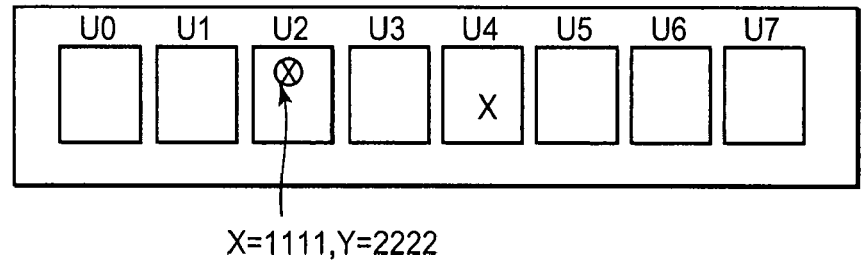
Figure 8:
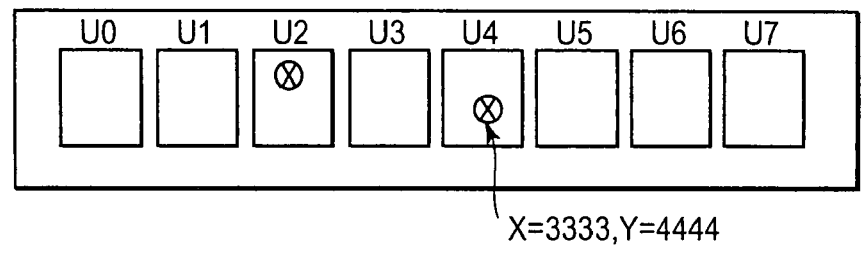

A first example of the present invention will be described in detail with reference to FIGS. 8, 9, and 10. The first example employs an operation mode in the memory module. Only a specific DRAM is selected in the memory module, and a redundant circuit is replaced in that DRAM. In the first example, each of the DRAMs has the operation mode circuit as described in connection with FIG. 6.

Operation of the first example will be described with reference to FIG. 8. In Step 1, the quality is determined in a test operation after the memory module has been assembled. It is assumed that defective bits are present in DRAMs U2 (X=1111, Y=2222) and U4 (X=3333, Y=4444) out of DRAMs U0 to U7. Next, redundant memory addresses that have been replaced in the respective DRAMs mounted in the memory module are read in Step 2 by using a roll call test function. As with the first embodiment, the first redundant memory addresses that do not overlap redundant memory addresses for other DRAMs are used as identifier information (ID) for the DRAMs. For example, it is assumed that that identifier information (ID) is U2 (X=0123) and U4 (X=0012).

Subsequently, in Step 3, an entry into a chip select test mode is made by a command of an external input signal, and the test chip select signal is brought into a high level H. An X-address activation signal (ACT command) and an ID address X=0123 for U2 are inputted so as to select the DRAM U2. In the DRAM U2, the test chip select flag signal $S_{TCSF}$ is brought into a high level H. Thus, the DRAM U2 is brought into an operation mode. In the other DRAMs (U0, U1, and U3 to U7), the test chip select flag signal remains a low level L, and thus those DRAMs are not in an operation mode. Furthermore, an entry into an electric fuse redundant circuit is made by a redundant circuit entry command, and an electric fuse activation signal $S_{EFA}$ is brought into a high level H. An electric fuse write signal $S_{EFW}$ is brought into a high level H via an AND circuit 28. A defective memory address (X=1111, Y=2222) in U2 is inputted together with an ACT command and a write (WRT) command. The defective memory in the DRAM U2 is replaced with an electric fuse redundant memory in an electric fuse redundant circuit 29.

When a pre-charge command PRE is inputted, the test chip select signal $S_{TCS}$, the test chip select flag signal $S_{TCSF}$, the electric fuse activation signal $S_{EFA}$, and the electric fuse write signal $S_{EFW}$ are all brought into a low level L. The test chip select flag signal $S_{TCSF}$ for the DRAM U2 is brought into a low level L by the test chip select reset signal $S_{TCSR}$, and the DRAM U2 is also deactivated. In Step 3, only the DRAM U2 is selected, and a write operation to an electric fuse is performed. At that time, the other DRAMs (U0, U1, and U3 to U7) are not in an operation mode, and no write operation to an electric fuse is performed. In Step 4, a defective memory in the DRAM U4 is replaced with an electric fuse as with Step 3. The aforementioned operation allows the respective defective memories in the two DRAMs to be replaced with the electric fuses.

Figure 9:
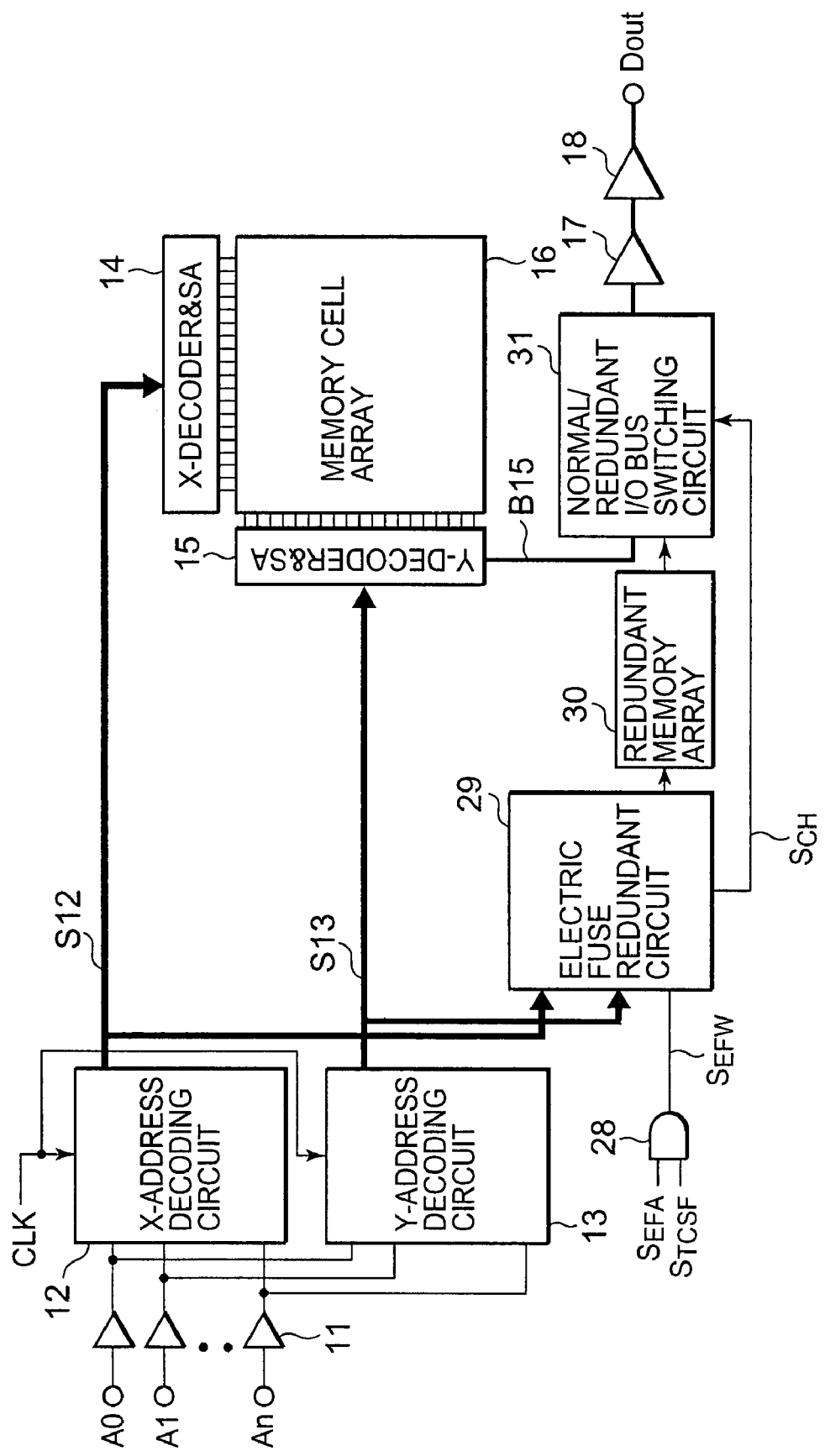
FIG. 9 is a block diagram explanatory of the replacement with the redundant circuits in the first example of the present invention.
Figure 10:
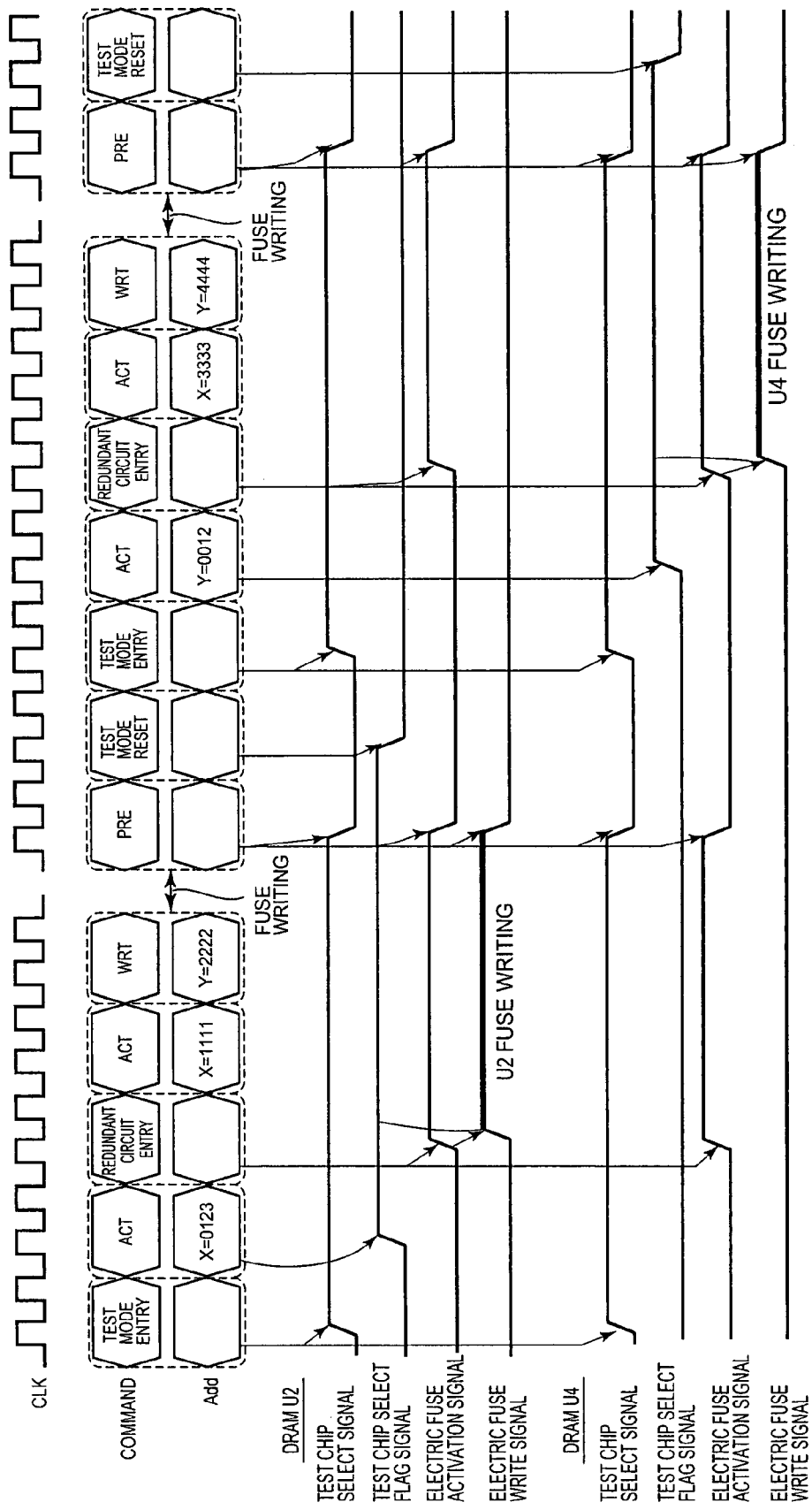
FIG. 10 is a timing chart explanatory of the replacement with the redundant circuits in the first example of the present invention.

FIG. 9 is a block diagram showing an arrangement for replacement with a redundant circuit. FIG. 9 also shows only the components which are necessary for explanation of an operation of the DRAM according to the present invention. If an electric fuse activation signal $S_{EFA}$ having a high level H and a test chip select flag signal $S_{TCSF}$ having a high level H are inputted to the AND circuit 28, then the AND circuit 28 outputs an electric fuse write signal $S_{EFW}$ having a high level H to the electric fuse redundant circuit 29. The electric fuse redundant circuit 29 is a control circuit including an electric fuse. A redundant memory array 30 is controlled by the electric fuse redundant circuit 29. A normal/redundant I/O bus switching circuit 31 is operable to switch between a normal output from the memory cell array 16 and an output from the redundant memory array 30 based on a normal/redundant I/O bus switching signal $S_{CH}$ from the electric fuse redundant circuit 29. With the above arrangement, a replacement operation with a redundant circuit can be performed only for a selected DRAM by inputting the test chip select flag signal $S_{TCSF}$ to the AND circuit 28. Other circuit operations can be understood from the aforementioned procedures, and the details thereof will be omitted from the following description.

In the memory module having DRAMs according to the present invention, a specific DRAM can be selected and operated from among a plurality of DRAMs. Accordingly, a replacement operation with a redundant circuit can be performed only for a defective DRAM that has been found in an assembly process of the memory module. Since the replacement operation is performed only for the defective DRAM, redundant circuits in DRAMs other than the defective DRAM are prevented from being used unnecessarily. Thus, the redundant circuits in the respective DRAMs can be utilized effectively. As a result, it is possible to obtain a semiconductor memory device and a memory module having an improved efficiency of redundant circuits and an increased yield.

SECOND EXAMPLE

Figure 11:
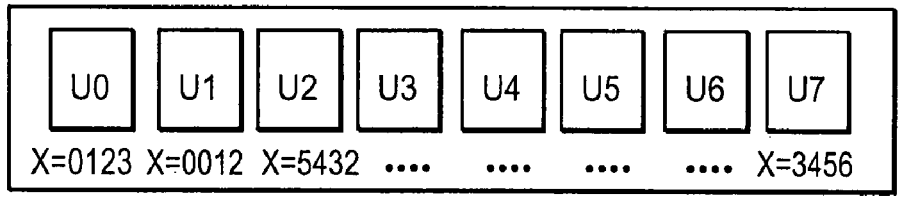
FIG. 11 is a diagram explanatory of a standby operation procedure in a second example of the present invention.
Figure 11:
Figure 11:
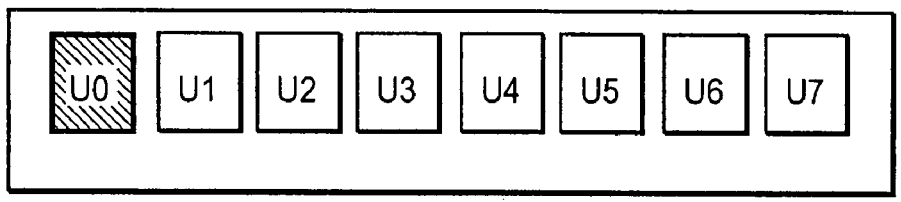
Figure 11:
Figure 11:
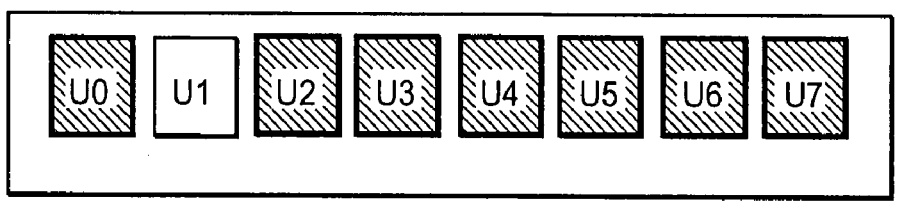
Figure 11:
Figure 11:
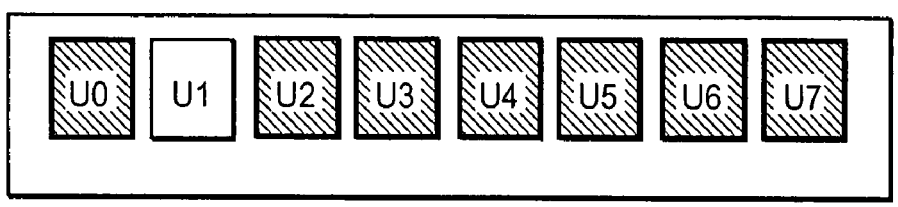

A second example of the present invention will be described in detail with reference to FIGS. 11 and 12. The second example employs a forced standby mode in the memory module. A first selected DRAM is brought into a forced standby mode while the rest of DRAMs are operated. FIG. 11 is a diagram explanatory of a procedure in the second example. FIG. 12 is a timing chart of operation in the second example. In the second example, each of the DRAMs has the forced standby mode circuit as described in connection with FIG. 7. However, some of the command input initial-stage circuits for generating a test chip select reset signal are general buffer circuits. In the second example, a test operation is performed on only one DRAM U1 out of DRAMs U0 to U7 mounted on the memory module.

In Step 1, redundant memory addresses that have been replaced in the respective DRAMs mounted in the memory module are read by using a roll call test function. As with the first example, the first redundant memory addresses that do not overlap redundant memory addresses for other DRAMs are used as identifier information (ID) for the DRAMs. For example, it is assumed that that identifier information (ID) is U0 (X=0123), U1 (X=0012), U2 (X=5432), . . . , and U7 (X=3456).

Subsequently, in Step 2, an entry into a chip select test mode is made by a command of an external input signal, and a test chip select signal is brought into a high level H for all of the DRAMs. An X-address activation signal (ACT command) and an ID address (X=0123) for U0 are inputted so as to select the DRAM U0 having an ID address that coincides with the inputted ID address. In the DRAM U0, the test chip select flag signal is brought into a high level H. The other DRAMs (U1 to U7) have ID addresses that do not coincide with the inputted ID address, and thus the test chip select flag signal remains a low level L. Furthermore, an entry into a forced standby test mode is made by a standby mode command, and the forced standby test signal is brought into a high level H for all of the DRAMs. Only in the DRAM U0, in which the test chip select flag signal has a high level H, the forced standby mode entry is brought into a high level H, so that the DRAM U0 is brought into a forced standby state. In the other DRAMs (U1 to U7), the test chip select flag signal has a low level L, and the forced standby entry remains a low level L. Thus, those DRAMs are not brought into a forced standby state.

Next, a pre-charge command PRE is inputted. Operations are different between the DRAM U0, which has been selected in the previous chip select test mode and held in a forced standby state, and the other DRAMs (U1 to U7). In the DRAM U0 having a forced standby state, the input initial-stage circuits 26 (FIG. 7) have a disabled state, and the pre-charge command PRE is disabled. Accordingly, the DRAM U0 maintains the previous state. The DRAM U0 disables a subsequently inputted command and maintains that state until the test chip select reset signal is inputted. In the other DRAMs (U1 to U7), the test chip select signal and the forced standby test signal are brought into a low level L by the pre-charge command PRE.

In Step 3, an entry into a chip select test mode is made again by a command input, and the test chip select signal is brought into a high level H. An ACT command and an ID address (X=5432) for U2 are inputted so as to select the DRAM U2 having an ID address that coincides with the inputted ID address. In the DRAM U2, the test chip select flag signal is brought into a high level H. The DRAMs (U1 and U3 to U7) have ID addresses that do not coincide with the inputted ID address, and thus the test chip select flag signal remains a low level L. Furthermore, an entry into a forced standby test mode is made, and the forced standby test signal is brought into a high level H. Only in the DRAM U2, in which the test chip select flag signal has a high level H, a forced standby test entry is brought into a high level H so as to bring the DRAM U0 into a forced standby test state. In other DRAMs (U1 and U3 to U7), the test chip select flag signal has a low level L, and the forced standby test entry remains a low level L. Thus, those DRAMs are not brought into a forced standby test state. In the DRAM U0, all commands inputted in Step 3 are disabled, and the DRAM U0 maintains the previous state.

A pre-charge command PRE is inputted. Operations are different between the DRAMs U0 and U2, which have been selected in the second last and the last chip select test modes and held in a forced standby state, and the other DRAMs (U1 and U3 to U7). In the DRAMs U0 and U2 having a forced standby state, the input initial-stage circuits 26 (FIG. 7) have a disabled state, and the pre-charge command PRE is disabled. Accordingly, the DRAMs U0 and U2 maintain the previous state. The DRAMs U0 and U2 disable a subsequently inputted command and maintain that state until the test chip select reset signal is inputted. In the other DRAMs (U1 and U3 to U7), the test chip select signal and the forced standby test signal are brought into a low level L by the pre-charge command PRE. In this manner, the rest of the DRAMs (U3 to U7) are brought into a forced standby state by repeating an input of a pre-charge command PRE from the chip select test mode entry. As a result, only the DRAM (U1) can be operated while the DRAMs (U0 and U2 to U7) are brought into a forced standby state.

In Step 4, an entry into a test mode is made, and an ACT command and an operation command (e.g., a read and write command) are inputted. Since the DRAMs (U0 and U2 to U7) have a forced standby state, these commands are disabled so that the DRAMs (U0 and U2 to U7) are not operated. The DRAM U1 is operated in accordance with the inputted commands. That is, it is possible to operate only the DRAM U1. Thus, an operating current of a specific DRAM in the memory module can be measured by operating only the specified DRAM. Furthermore, it is possible to recover a redundant circuit only in the specified DRAM. Moreover, in a tester device having a low power source capability, a test operation can be performed only on DRAMs as many as the tester device can measure.

A memory module according to the present invention has a plurality of DRAMs that are concurrently operated. A specific DRAM can be selected and operated from among the plurality of DRAMs mounted in the memory module. DRAMs other than the specified DRAM are forcedly brought into a standby state, and a test operation can be performed only on the specified DRAM. Thus, an operating current of a specific DRAM in a memory module can be measured by performing a test operation only on the specified DRAM. Furthermore, it is possible to recover a redundant circuit only in the specified DRAM. Moreover, in a tester device having a low power source capability, a test operation can be performed only on DRAMs as many as the tester device can measure.

Further, a DRAM according to the present invention has a chip select circuit and is selectable by a test chip select signal. An address that has been replaced with a redundant circuit in the DRAM is used as identifier information (ID) specific to the DRAM. When the inputted address coincides with the identifier information (ID), only the selected DRAM is brought into an operation mode or a standby mode. In a memory module on which such DRAMs are mounted, only a specific DRAM can be brought into an operation mode or a standby mode by inputting an address of identifier information (ID). With such configuration, it is possible to perform a test operation on a specific DRAM and recover the specific DRAM with a redundant circuit. Furthermore, in a tester device having a low power source capability, a test operation can be performed only on DRAMs as many as the tester device can measure. Accordingly, it is possible to obtain a semiconductor memory device and a memory module having an excellent efficiency and yield.

Although the present invention has been described based on the illustrated embodiment and the two examples, the present invention is not limited to the illustrated embodiment and the two examples. It should be understood that various changes and modifications may be made therein without departing from the spirit of the present invention and are thus included in the scope of the present invention. Although the above embodiment has been described using DRAMs as semiconductor memory devices, the present invention is not limited to DRAMs and can be applied to other storage devices such as SRAM using a redundant circuit.

What is claimed is:

1. A semiconductor memory device having a redundant circuit, characterized by comprising:
   a chip select circuit operable to determine whether to be selected by a test chip select signal and a redundancy enable signal and output a chip select flag signal in a chip select test mode.

2. The semiconductor memory device as recited in claim 1, characterized in that a defective memory address that has been replaced with the redundant circuit is used as identifier information for the semiconductor memory device in the chip select test mode.

3. The semiconductor memory device as recited in claim 2, characterized in that the identifier information is a defective memory address read in a redundant memory address read test operation by a tester device, and the read defective memory address is stored as the identifier information in the tester device.

4. The semiconductor memory device as recited in claim 3, characterized in that the semiconductor memory device having identifier information that coincides with an input address from the tester device is set to one of an operation mode and a standby mode.

5. The semiconductor memory device as recited in claim 3, characterized in that only the semiconductor memory device having identifier information that coincides with an input address from the tester device is activated so that a defective memory is replaced with a redundant circuit.

6. The semiconductor memory device as recited in claim 1, characterized in that an internal circuit is set to one of an operation mode and a standby mode by the chip select flag signal.

7. The semiconductor memory device as recited in claim 6, characterized in that an input initial-stage circuit is disabled in the standby mode.

8. The semiconductor memory device as recited in claim 6, characterized in that the standby mode is maintained until a reset signal for the standby mode is inputted.

9. A memory module characterized by comprising the semiconductor memory device as recited in any one of claims 1 to 8.

10. A test method of a memory module having a plurality of semiconductor memory devices including a redundant circuit, and comprising the steps of:
    providing a chip select circuit for the semiconductor memory devices;
    reading a defective memory address that has been replaced with the redundant circuit;
    holding the read defective memory address as identifier information for each semiconductor memory device in a tester device; and
    outputting a chip select flag signal indicative of selection or non-selection from the chip select circuit based on inputted identifier information.

11. The test method of a memory module as recited in claim 10, characterized in that the chip select circuit is operable to determine whether to be selected by a test chip select signal and a redundancy enable signal.

12. The test method of a memory module as recited in claim 10, characterized in that, among the read defective memory addresses, a first defective memory address that does not overlap defective memory addresses for other semiconductor memory devices mounted in the same memory module is used as identifier information.

13. The test method of a memory module as recited in claim 10, characterized in that a semiconductor memory device selected by the chip select flag signal outputted from the chip select circuit is operated in accordance with an inputted command.

14. The test method of a memory module as recited in claim 10, characterized in that a replacement operation with a redundant circuit is performed on a semiconductor memory device selected by the chip select flag signal outputted from the chip select circuit in accordance with an inputted redundant circuit entry command.

15. The test method of a memory module as recited in claim 10, characterized in that a semiconductor memory device selected by the chip select flag signal outputted from the chip select circuit is brought into a standby state in accordance with an inputted standby mode command.

* * * * *